(12) United States Patent
Nagaya et al.

(10) Patent No.: US 6,710,435 B2
(45) Date of Patent: Mar. 23, 2004

(54) SEMICONDUCTOR DEVICE ARRANGEMENT AND METHOD OF FABRICATING THE SAME

(75) Inventors: Masatake Nagaya, Seto (JP); Toshiyuki Morishita, Iwakura (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/201,158

(22) Filed: Jul. 24, 2002

(65) Prior Publication Data

US 2003/0032246 A1 Feb. 13, 2003

(30) Foreign Application Priority Data

Aug. 9, 2001 (JP) ........................................ 2001-241743

(51) Int. Cl.[7] .............................................. H01L 23/02
(52) U.S. Cl. ........................ 257/686; 257/685; 257/678; 257/673; 257/689; 257/692; 257/723; 257/698
(58) Field of Search ................................ 257/686, 685, 257/673, 692, 689, 698, 678, 723

(56) References Cited

U.S. PATENT DOCUMENTS

| | | | |
|---|---|---|---|
| 4,801,992 A | | 1/1989 | Golubic |
| 5,241,450 A | * | 8/1993 | Bernhardt et al. .......... 361/689 |
| 5,955,776 A | | 9/1999 | Ishikawa |
| 6,008,530 A | * | 12/1999 | Kano .......................... 257/686 |
| 6,137,691 A | * | 10/2000 | Jang ............................ 361/784 |

FOREIGN PATENT DOCUMENTS

| | | |
|---|---|---|
| JP | 6-5665 | 1/1994 |
| JP | 7-86493 | 3/1995 |
| JP | 8-298304 | 11/1996 |
| JP | 9-205177 | 8/1997 |
| JP | 10-256476 | 9/1998 |
| JP | 2000-101020 | 4/2000 |

* cited by examiner

*Primary Examiner*—Van Thu Nguyen
*Assistant Examiner*—Douglas Menz
(74) *Attorney, Agent, or Firm*—Posz & Bethards, PLC

(57) ABSTRACT

A semiconductor device arrangement includes a plurality of three-dimensional semiconductor units. Each of the three-dimensional semiconductor units includes a semiconductor chip in a shape of a rectangular parallelepiped having six surfaces, and semiconductor devices formed on at least one among the six surfaces. The three-dimensional semiconductor units are mechanically connected and supported, and are electrically connected in a suitable way.

22 Claims, 16 Drawing Sheets

TAKING UP

HORIZONTAL LINE

θ: TILT ANGLE

HORIZONTAL LINE

SEMICONDUCTOR DEVICE ARRANGEMENT AND METHOD OF FABRICATING THE SAME

BACKGROUND OF THE INVENTION

1. Field of the Invention

This invention relates to an arrangement of semiconductor devices. In addition, this invention relates to a method of fabricating a semiconductor device arrangement.

2. Description of the Related Art

Japanese patent application publication number 7-86493 discloses a multi-chip module including a three-dimensional glass substrate having the shape of a cube or a rectangular parallelepiped. The three-dimensional glass substrate is mounted on a main substrate. One of the surfaces of the three-dimensional glass substrate contacts with the main substrate. Wiring lines, bare LSI chips, resistors, and capacitors are formed and mounted on the other surfaces of the three-dimensional glass substrate by a sequence of steps. The total number of the steps tends to be relatively large.

Japanese patent application publication number 6-5665 discloses that holes are formed in a surface of an IC wafer at positions on cutting lines, and electrodes are provided in the holes respectively. The formation of the holes uses, for example, wet etching or dry etching. The holes are of the through type or the recess type. After the electrodes are provided, the IC wafer is cut along the cutting lines so that IC chips are made. Electrodes are exposed at the side surfaces of each IC chip. Plural IC chips can be superposed while being aligned. Electrical connections among the IC chips in the superposition can easily be provided by use of the electrodes at the side surfaces of the IC chips. The total number of the holes in the IC wafer tends to be relatively large. In the case where the holes are formed in the IC wafer by wet etching or dry etching after IC patterns are provided thereon, particles tend to cause pinholes in the IC wafer and also breaks of wiring lines thereon.

Japanese patent application publication number P2000-101020A discloses a semiconductor chip having plural surfaces which are provided with semiconductor devices respectively. The semiconductor chip is fabricated as follows. An array of first LSI's (semiconductor devices) is formed on an upper surface of a silicon wafer. Then, the silicon wafer is cut into sample blocks by a scribing procedure or a dicing procedure using one, of a diamond blade and a wire saw. The sample blocks have first surfaces provided with the first LSI's respectively. The sample blocks are rearranged into a pseudo wafer having an upper surface formed by second surfaces of the sample blocks. An array of second LSI's (semiconductor devices) is formed on the upper surface of the pseudo wafer. The second surfaces of the sample blocks are provided with the second LSI's respectively. Each sample block may be formed with a wiring pattern for electrically connecting the first and second LSI's thereon. Each sample block can be used as a semiconductor chip. The scribing procedure or the dicing procedure tends to generate distortions in the resultant sample blocks which might cause failures of LSI's. The rearrangement of the sample blocks into the pseudo wafer is troublesome.

U.S. Pat. No. 5,955,776 corresponding to Japanese patent application publication number 2001-501779 discloses a spherical shaped semiconductor integrated circuit called a ball. Initially, a crystal formation process forms a single spherical crystal. Upon the formation of the spherical crystal, a fabrication process constructs a circuit onto the spherical crystal to form a ball. A plurality of balls are made. Then, a clustering process connects the balls with each other and other devices such as printed circuit boards. The fabrication process and the clustering process tend to have complicated steps.

Japanese patent application publication number 10-256476 discloses a columnar semiconductor device which is fabricated as follows. A reticle has a circuit pattern. A light beam is applied to a slit-like region of the circuit pattern on the reticle before being focused on the cylindrical surface of a silicon column. This step transfers a part of the circuit pattern onto the cylindrical surface of the silicon column. As the beam-applied slit-like region is moved across the circuit pattern, the silicon column is rotated about its axis. Therefore, the whole of the circuit pattern is transferred onto the cylindrical surface of the silicon column to form a columnar semiconductor device. Position detection marks are provided on the silicon column. A position detecting system uses the position detection marks in sensing a positional error of the silicon column. The positional error of the silicon column is corrected before the circuit pattern is transferred onto the cylindrical surface thereof. Plural semiconductor devices are juxtaposed while being connected with each other and being connected with a power supply line by bumps.

Japanese patent application publication number 9-205177 discloses a semiconductor device having a hexahedral package. The top, bottom, and sides of the package are formed by printed wiring boards. Semiconductor chips are mounted on the inner surfaces of the printed wiring boards which form the sides of the package. Connection terminals are provided on the outer surfaces of the printed wiring boards which form the top, bottom, and sides of the package. The connection terminals are electrically connected with the semiconductor chips. Each of the connection terminals has a male connector and a female connector integral with each other. A cylindrical pipe for conducting cooled air extends through the package. Specifically, the cylindrical pipe extends between the top and the bottom of the package. Plural semiconductor devices are two-dimensionally or three-dimensionally arranged while the connection terminals thereon are fitted into each other. In this case, the semiconductor devices compose a large electronic circuit.

Japanese patent application publication number 8-298304 discloses a temperature-controllable block for carrying chips. The block has a hexahedral hollow body. Connectors for receiving chips are provided on the outer surfaces of the top, bottom and sides of the body. Each of the connectors has a recess for receiving a chip, and wiring metal members. The chips received by the connectors can be electrically connected with each other by wires. An inlet pipe and an outlet pipe in communication with the interior space of the body are supported by the body walls. Temperature controlling fluid such as air, oil, or water can be introduced into the interior of the body via the inlet pipe. The temperature controlling fluid can be moved from the interior of the body via the outlet pipe.

U.S. Pat. No. 4,801,992 discloses a modular circuit including individual planar integrated circuits which are connected together and to an interconnect chip. The modular circuit is fabricated as follows. Individual integrated circuits are formed on a wafer. Then, metal lines are formed on the wafer. Thereafter, individual circuit chips are formed by cutting the wafer. Four individual circuit chips are assembled together over a hollow core. The core may provide both a mounting surface for the individual circuit chips and a heat transfer device for dissipating heat from the individual circuit chips. The individual circuit chips may be electrically connected by related metal lines. The four integrated circuit chips composing the hollow core are attached to a fifth side of a cube which comprises a bump chip with various interconnect lines to the other four integrated circuit chips. The integrated circuit cube is bump mounted to a laminated area array tape which is in turn mounted to a lead line package.

SUMMARY OF THE INVENTION

It is a first object of this invention to provide an improved semiconductor device arrangement.

It is a second object of this invention to provide a method of fabricating an improved semiconductor device arrangement.

A first aspect of this invention provides a semiconductor device arrangement comprising a plurality of three-dimensional semiconductor units, wherein each of the three-dimensional semiconductor units includes a semiconductor chip in a shape of a rectangular parallelepiped having six surfaces, and semiconductor devices formed on at least one among the six surfaces; and means for mechanically connecting and supporting the three-dimensional semiconductor units, and electrically connecting the three-dimensional semiconductor units.

A second aspect of this invention is based on the first aspect thereof, and provides a semiconductor device arrangement wherein the semiconductor chips in the three-dimensional semiconductor units have through holes respectively, and the means comprises one of a wire and a rod inserted into the through holes to mechanically connect and support the three-dimensional semiconductor units.

A third aspect of this invention is based on the first aspect thereof, and provides a semiconductor device arrangement wherein the semiconductor chips in the three-dimensional semiconductor units have through holes respectively, and the means comprises one of a wire electrode and a rod electrode inserted into the through holes to electrically connect the three-dimensional semiconductor units.

A fourth aspect of this invention is based on the first aspect thereof, and provides a semiconductor device arrangement wherein the semiconductor chips in the three-dimensional semiconductor units have through holes respectively, and the means comprises electrically conductive films formed on inner surfaces of the semiconductor chips which define the through holes to electrically connect the three-dimensional semiconductor units.

A fifth aspect of this invention is based on the first aspect thereof, and provides a semiconductor device arrangement wherein at least one of the three-dimensional semiconductor units has at least one flat surface formed with an electrode.

A sixth aspect of this invention is based on the fifth aspect thereof, and provides a semiconductor device arrangement wherein the electrode comprises a flat electrode.

A seventh aspect of this invention is based on the sixth aspect thereof, and provides a semiconductor device arrangement wherein the means comprises a flat electrode on first one of the three-dimensional semiconductor units and a flat electrode on second one of the three-dimensional semiconductor units which are in direct contact to electrically connect the first one and the second one of the three-dimensional semiconductor units.

An eighth aspect of this invention is based on the fifth aspect thereof, and provides a semiconductor device arrangement wherein the electrode comprises a bump.

A ninth aspect of this invention is based on the eighth aspect thereof, and provides a semiconductor device arrangement wherein the means comprises a bump on first one of the three-dimensional semiconductor units and a bump on second one of the three-dimensional semiconductor units which are directly bonded together to mechanically connect and support, and electrically connect the first one and the second one of the three-dimensional semiconductor units.

A tenth aspect of this invention is based on the fifth aspect thereof, and provides a semiconductor device arrangement wherein the electrode comprises a bonding pad.

An eleventh aspect of this invention is based on the tenth aspect thereof, and provides a semiconductor device arrangement wherein the means comprises a bonding pad on first one of the three-dimensional semiconductor units and a bonding pad on second one of the three-dimensional semiconductor units which are connected by a wire to electrically connect the first one and the second one of the three-dimensional semiconductor units.

A twelfth aspect of this invention is based on the second aspect thereof, and provides a semiconductor device arrangement wherein the semiconductor devices are formed on two sets of opposite surfaces among the six surfaces, and the through hole is open at the two remaining opposite surfaces among the six surfaces.

A thirteenth aspect of this invention is based on the first aspect thereof, and provides a semiconductor device arrangement wherein the semiconductor chips in the three-dimenisional semiconductor units have through holes respectively, and further comprising a pipe inserted into the through holes for conducting coolant.

A fourteenth aspect of this invention is based on the first aspect thereof, and provides a semiconductor device arrangement wherein the semiconductor devices comprise thin-wall portions of the semiconductor chips.

A fifteenth aspect of this invention is based on the first aspect thereof, and provides a semiconductor device arrangement wherein the three-dimensional semiconductor units are in a pillar-shaped stack.

A sixteenth aspect of this invention is based on the first aspect thereof, and provides a semiconductor device arrangement wherein the semiconductor devices comprise films formed on flat surfaces of the semiconductor chips.

A seventeenth aspect of this invention is based on the second aspect thereof, and provides a semiconductor device arrangement wherein each of the through holes has a circular cross-section.

An eighteenth aspect of this invention is based on the second aspect thereof, and provides a semiconductor device arrangement wherein each of the through holes has an angular cross-section.

A nineteenth aspect of this invention is based on the first aspect thereof, and provides a semiconductor device arrangement wherein the three-dimensional semiconductor units are in pillar-shaped stacks spaced at prescribed distances.

A twentieth aspect of this invention is based on the first aspect thereof, and provides a semiconductor device arrangement wherein a predetermined number of the three-dimensional semiconductor units are arranged in at least one among a vertical direction, a horizontal direction, and a height direction while surfaces of the three-dimensional semiconductor units are in contact or opposed to each other.

A twenty-first aspect of this invention is based on the first aspect thereof, and provides a semiconductor device arrangement wherein the semiconductor chips include silicon as semiconductor material.

A twenty-second aspect of this invention provides a method of fabricating a semiconductor device arrangement comprising a plurality of three-dimensional semiconductor units, wherein each of the three-dimensional semiconductor units includes a semiconductor chip in a shape of a rectangular parallelepiped having six surfaces, and semiconductor devices formed on at least one among the six surfaces; and means for mechanically connecting and supporting the three-dimensional semiconductor units, and electrically connecting the three-dimensional semiconductor units. The method comprises the steps of processing first opposite surfaces of a semiconductor body into mirror finished surfaces, wherein the semiconductor body will form each of the semiconductor chips in the three-dimensional semiconductor units; and forming a through hole in the semiconductor body, the through hole being open at second opposite surfaces of the semiconductor body which differ from the first opposite surfaces.

A twenty-third aspect of this invention provides a method of fabricating a semiconductor device arrangement comprising a plurality of three-dimensional semiconductor units, wherein each of the three-dimensional semiconductor units includes a semiconductor chip in a shape of a rectangular parallelepiped having six surfaces, and semiconductor devices formed on at least one among the six surfaces; and means for mechanically connecting and supporting the three-dimensional semiconductor units, and electrically connecting the three-dimensional semiconductor units. The method comprises the steps of forming a through hole in a semiconductor body, the through hole being open at first opposite surfaces of the semiconductor body, wherein the semiconductor body will form each of the semiconductor chips in the three-dimensional semiconductor units; and processing second opposite surfaces of the semiconductor body into mirror finished surfaces, the second opposite surfaces differing from the first opposite surfaces.

A twenty-fourth aspect of this invention is based on the twenty-second aspect thereof, and provides a method further comprising the steps of passing a wire through the through holes in the semiconductor chips; aligning the semiconductor chips on the wire; and conveying the semiconductor chips while keeping the semiconductor chips aligned on the wire.

A twenty-fifth aspect of this invention is based oh the twenty-fourth aspect thereof, and provides a method wherein the aligning step comprises contacting equal surfaces of the semiconductor chips with a reference surface of a jig while the semiconductor chips are on the wire.

A twenty-sixth aspect of this invention is based on the twenty-fourth aspect thereof, and provides a method wherein the conveying step comprises taking up the wire to move the semiconductor chips together with the wire.

A twenty-seventh aspect of this invention is based on the twenty-fourth aspect thereof, and provides a method wherein the conveying step comprises rolling the semiconductor, chips.

A twenty-eighth aspect of this invention is based on the twenty-fourth aspect thereof, and provides a method wherein the conveying step comprises tilting the wire to move the semiconductor chips along the wire.

A twenty-ninth aspect of this invention is based on the twenty-fourth aspect thereof, and provides a method wherein the conveying step comprises applying an air flow to the semiconductor chips on the wire to move the semiconductor chips along the wire.

A thirtieth aspect of this invention provides a method of fabricating a semiconductor device arrangement comprising a plurality of three-dimensional semiconductor units, wherein each of the three-dimensional semiconductor units includes a semiconductor chip in a shape of a rectangular parallelepiped having six surfaces, and semiconductor devices formed on at least one among the six surfaces; and means for mechanically connecting and supporting the three-dimensional semiconductor units, and electrically connecting the three-dimensional semiconductor units. The method comprises the steps of forming a film on a whole of an inner surface of a semiconductor chip which defines al through hole in the semiconductor chip; superposing a resist layer on the film; inserting an optical-fiber member into the through hole of the semiconductor chip, the optical-fiber member having a window; exposing the resist layer to light propagated from the optical-fiber member via the window; developing the resist layer into a first mask; patterning the film into a second mask while using the first mask, the second mask having at least one opening; and etching an area of the inner surface of the semiconductor chip which is exposed at the opening in the second mask to form a recess in the inner surface of the semiconductor chip.

A thirty-first aspect of this invention is based on the first aspect thereof, and provides a semiconductor device arrangement wherein the three-dimensional semiconductor units have bumps and are in pillar-shaped stacks including first and second pillar-shaped stacks neighboring each other, wherein three-dimensional semiconductor units in the first pillar-shaped stack are offset in height position from three-dimensional semiconductor units in the second pillar-shaped stack, and wherein bumps of a three-dimensional semiconductor unit in the first pillar-shaped stack are bonded to bumps of two three-dimensional semiconductor units in the second pillar-shaped stack.

DETAILED DESCRIPTION OF THE INVENTION

First Embodiment

Figure 1:
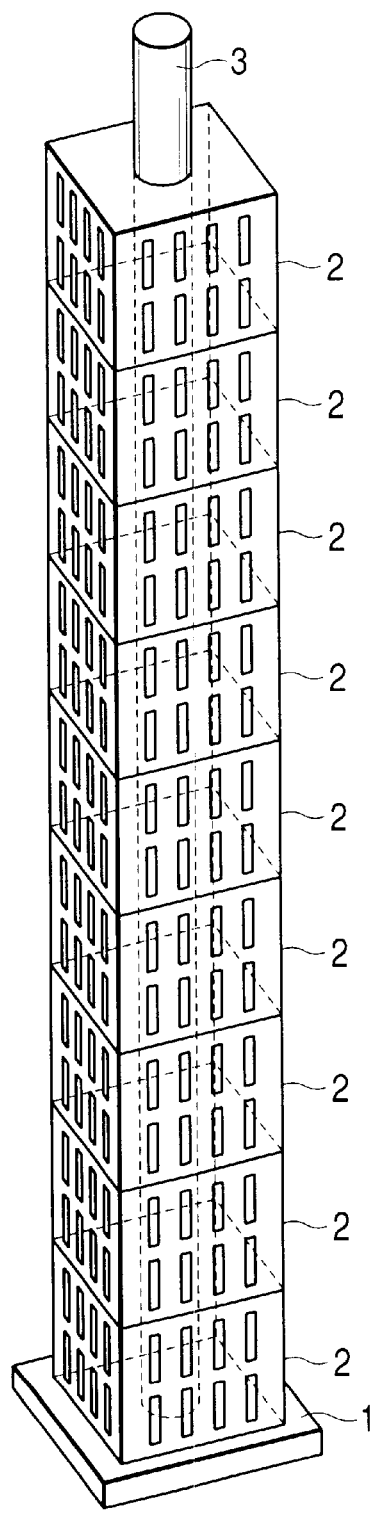
FIG. 1 is a perspective view of a semiconductor device arrangement according to a first embodiment of this invention.

FIG. 1 shows a semiconductor device arrangement according to a first embodiment of this invention. The arrangement of FIG. 1 includes a base plate 1 and three-dimensional semiconductor units (three-dimensional semiconductor elements) 2. The three-dimensional semiconductor units 2 are arranged in a pillar-shaped stack placed on the base plate 1. A rod-like electrode 3 extends through the three-dimensional semiconductor units 2. The rod-like electrode 3 is made of electrically conductive material. The rod-like electrode 3 is relatively high in mechanical strength. The three-dimensional semiconductor units 2 are mechanically connected and supported by the rod-like electrode 3. Furthermore, the three-dimensional semiconductor units 2 are electrically connected by the rod-like electrode 3.

Figure 2:
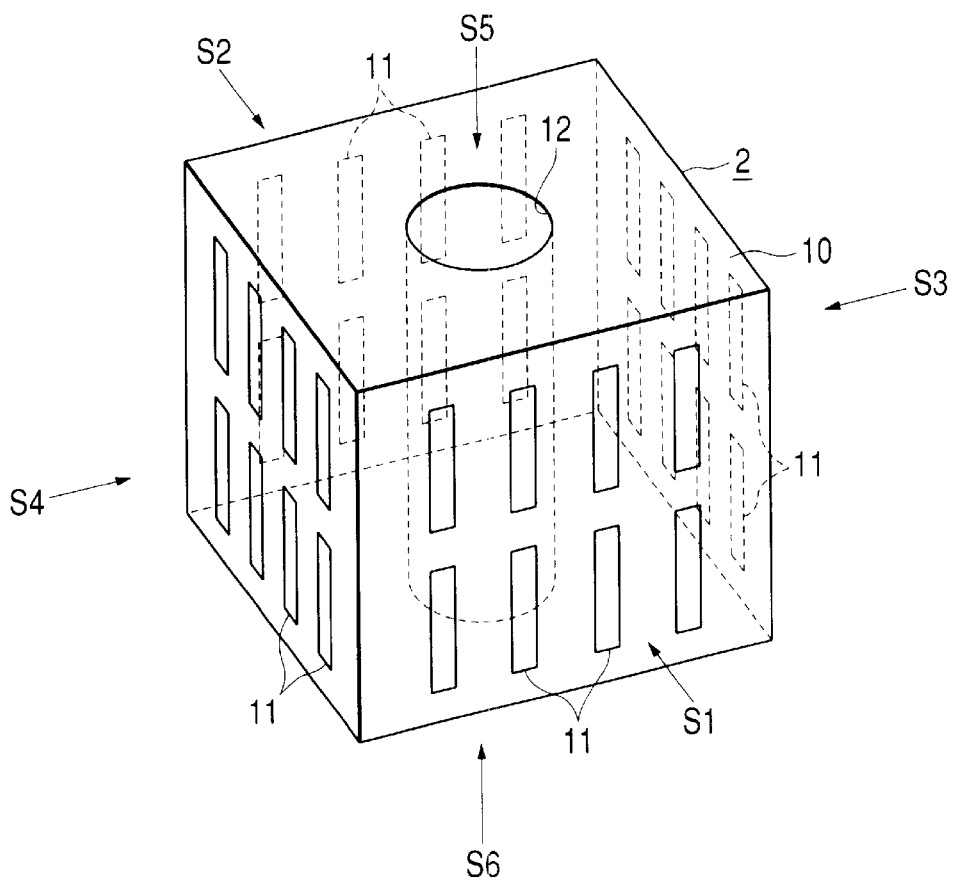
FIG. 2 is a perspective view of a three-dimensional semiconductor unit in FIG. 1.

As shown in FIG. 2, one three-dimensional semiconductor unit 2 includes a semiconductor chip 10 having the shape of a rectangular parallelepiped with six surfaces. A silicon chip is used as the semiconductor chip 10. The semiconductor chip 10 has a size of about 1 mm by about 1 mm by about 1 mm. In other words, the semiconductor chip 10 is about 1 mm in vertical dimension, about 1 mm in horizontal dimension, and about 1 mm in height. The six surfaces of the semiconductor chip 10 are square. Alternatively, the six surfaces of the semiconductor chip 10 may be rectangular. The six surfaces of the semiconductor chip 10 may include square ones and rectangular ones. The six surfaces of the semiconductor chip 10 are a front surface S1, a back surface S2, a right-hand surface S3, a left-hand surface S4, an upper surface S5, and a lower surface S6. Semiconductor devices (for example, integrated circuits) 11 are formed on the front surface S1, the back surface S2, the right-hand surface S3, and the left-hand surface S4. Films formed on flat surfaces of the semiconductor chip 10 compose the semiconductor devices 11.

The semiconductor chip 10 has a through hole 12 extending straight. One end of the through hole 12 opens at a central area of the upper surface S5. The other end of the through hole 12 opens at a central area of the lower surface S6. The through hole 12 is of a circular cross-section.

In this way, two sets of opposite surfaces S1, S2, S3, and S4 among the six surfaces S1–S6 of the semiconductor chip 10 are provided with the semiconductor devices 11. The through hole 12 is formed in the semiconductor chip 10 in a manner such that the two ends thereof open at the two remaining opposite surfaces S5 and S6. The rod-like electrode 3 (see FIG. 1) is accommodated in the through hole 12.

The rod-like electrode 3 is inserted and fitted into the through holes 12 in the semiconductor chips 10 so that the three-dimensional semiconductor units 2 are mechanically connected and supported, and are electrically connected.

The rod-like electrode 3 may be replaced by a rod-like member for mechanically connecting and supporting the three-dimensional semiconductor units 2. The rod-like member may be replaced by a wire. The rod-like electrode 3 may be replaced by a wire electrode for electrically connecting the three-dimensional semiconductor units 2.

The through hole 12 may be of an angular cross-section, a square cross-section, or a rectangular cross-section.

Figure 3:
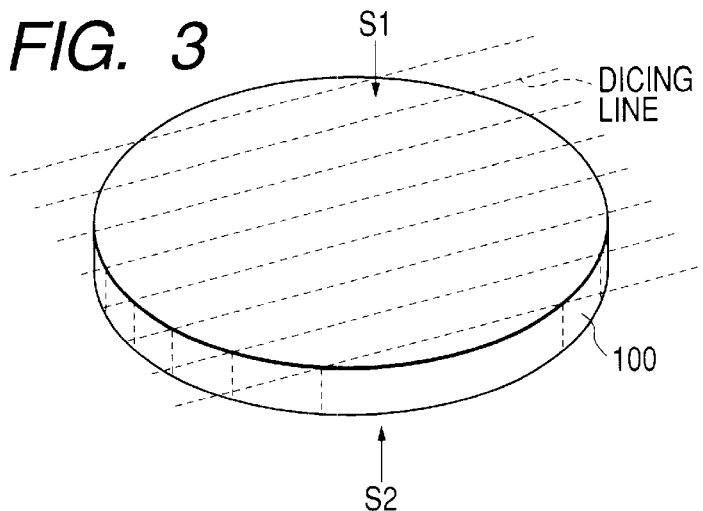
FIG. 3 is a perspective view of a semiconductor wafer.

A method of fabricating semiconductor chips 10 will be described below. As shown in FIG. 3, major surfaces of a semiconductor wafer 100 are processed or polished into mirror finished surfaces which will form the two opposite surfaces S1 and S2 of each semiconductor chip 10. Then, the semiconductor wafer 100 is diced along parallel lines spaced at prescribed equal intervals, being divided into semiconductor rods.

Figure 4:
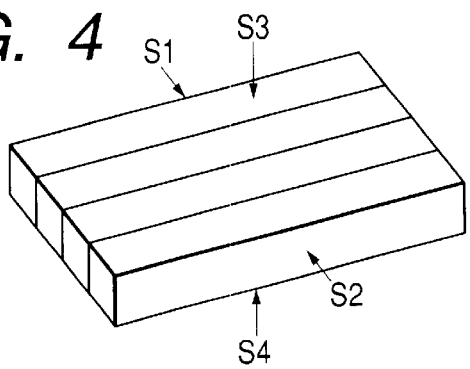
FIG. 4 is a perspective view of a juxtaposition of semiconductor rods which result from dicing the semiconductor wafer in FIG. 3.

Subsequently, as shown in FIG. 4, the semiconductor rods are juxtaposed in a manner such that first dicing-resultant surfaces thereof compose a first major surface of the juxtaposition while second dicing-resultant surfaces thereof compose a second major surface of the juxtaposition which is opposite to the first major surface. The first and second major surfaces of the juxtaposition are processed, ground, lapped, or polished into mirror finished surfaces which will form the two opposite surfaces S3 and S4 of each semiconductor chip 10.

The mirror finished surfaces S1, S2, S3, and S4 are free from processing-caused degenerated layers. Therefore, the semiconductor devices 11 formed on the mirror finished surfaces S1, S2, S3, and S4 are prevented from failing due to processing-caused distortions remaining in the wafer cutting surfaces.

Figure 5:
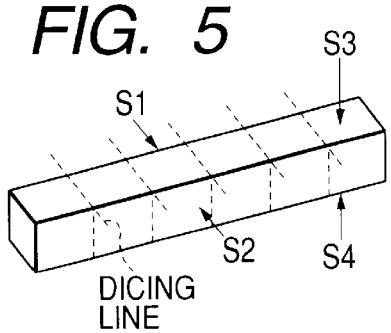
FIG. 5 is a perspective view of a semiconductor rod in FIG. 4.
Figure 6:
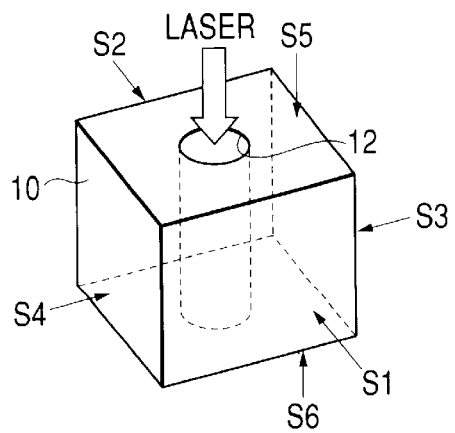
FIG. 6 is a perspective view of a semiconductor chip which results from dicing the semiconductor rod in FIG. 5.

After the mirror finished surfaces (S3 and S4) are made, each of the semiconductor rods is processed as follows. Specifically, as shown in FIG. 5, a semiconductor rod is diced along parallel lines spaced at prescribed equal intervals, being divided into semiconductor chips 10. Subsequently, as shown FIG. 6, a laser beam is applied to a semiconductor chip 10 so that a through hole 12 is formed therein. The through hole 12 opens at central areas of the two remaining opposite surfaces S5 and S6 of the semiconductor chip 10 which have not been processed into mirror finished surfaces. The application of the laser beam forms the through hole 12 in a short time. Preferably, plural semiconductor chips 10 are aligned, and the laser beam is applied to the alignment of the semiconductor chips 10 to form the through holes 12 therein.

The division of the semiconductor wafer 100 into the semiconductor chips 10 may include a step of cleaving a semiconductor body into semiconductor segments along planes accorded with a specified crystal plane. In the case where silicon is used as semiconductor material, the resultant surfaces (the cleavage surfaces) can agree in common with a (100) crystal plane and the mobilities in semiconductor devices 11 formed thereon can be equalized.

The through hole 12 may be provided in each semiconductor chip 10 by chemical etching. Holes which will form the through holes 12 in the semiconductor chips 10 may be provided in the semiconductor wafer 100. In this case, after the holes are provided, the semiconductor wafer 100 is processed to have mirror finished surfaces which will form the two opposite surfaces S1 and S2 of each semiconductor chip 10. A hole which will form the through holes 12 in the semiconductor chips 10 may be provided in each semiconductor rod. In this case, after the hole is provided, the semiconductor rod is processed to have mirror finished surfaces which will form the two opposite surfaces S3 and S4 of each semiconductor chip 10.

Figure 7:
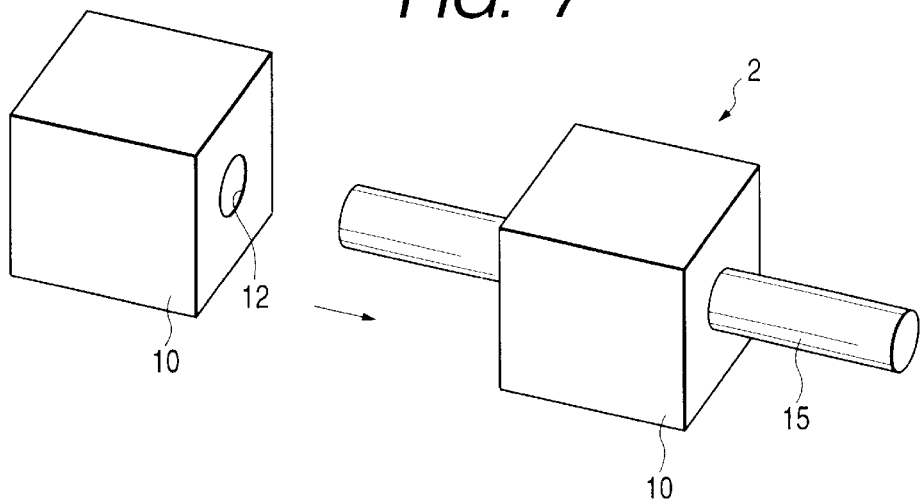
FIG. 7 is a perspective view of a semiconductor chip and a wire for conveying the semiconductor chip.
Figure 8:
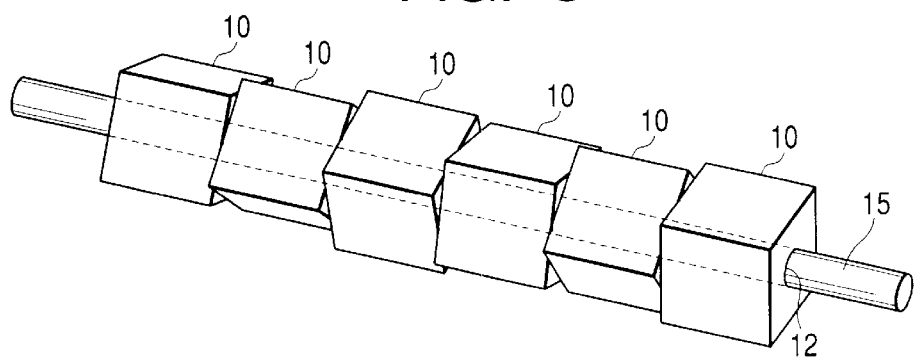
FIG. 8 is a perspective view of semiconductor chips and a wire.
Figure 9:
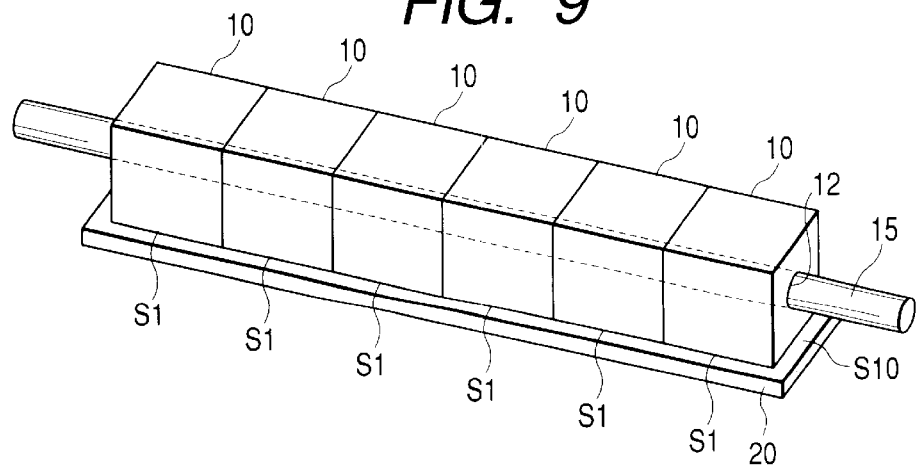
FIG. 9 is a perspective view of aligned semiconductor chips, a wire, and a flat plate.
Figure 10:
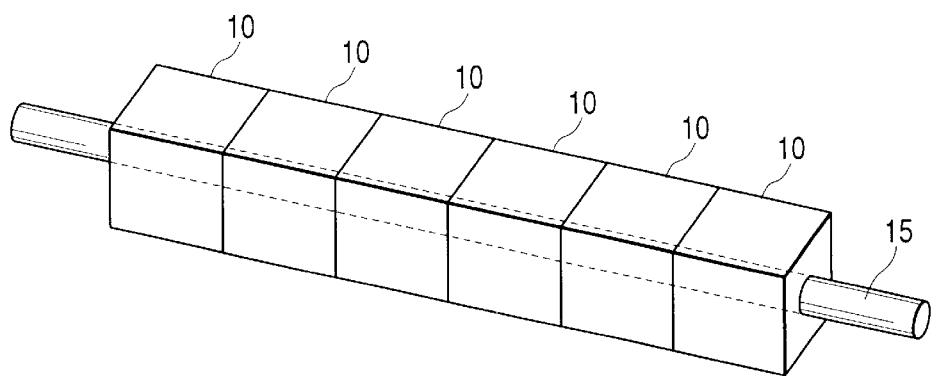
FIG. 10 is a perspective view of aligned semiconductor chips and a wire.

A method of conveying semiconductor chips 10 will be described below. The conveyance of the semiconductor chips 10 is designed as movement thereof among places for processing the four surfaces S1, S2, S3, and S4 of each of the semiconductor chips 10. The through holes 12 are utilized for the conveyance of the semiconductor chips 10. Specifically, as shown in FIGS. 7 and 8, a wire 15 is passed through the holes 12 in semiconductor chips 10. The semiconductor chips 10 on the wire 15 are gathered in a group. Thereafter, as shown in FIG. 9, the equal surfaces (for example, the surfaces S1) of the semiconductor chips 10 are brought into contact with a major surface S10 of a jig formed by a flat plate 20. Consequently, as shown in FIG. 10, the semiconductor chips 10 on the wire 15 are aligned. During the alignment, the major surface S10 of the flat plate 20 is used as a reference surface.

Thus, surface alignment of the semiconductor chips 10 is implemented as follows. While the wire 15 extends through the holes 12 in the semiconductor chips 10, the same surfaces (for example, the surfaces S1) of the semiconductor chips 10 are brought into contact with the reference surface S10. It should be noted that the wire 15 may be replaced by a rod.

Figure 11:
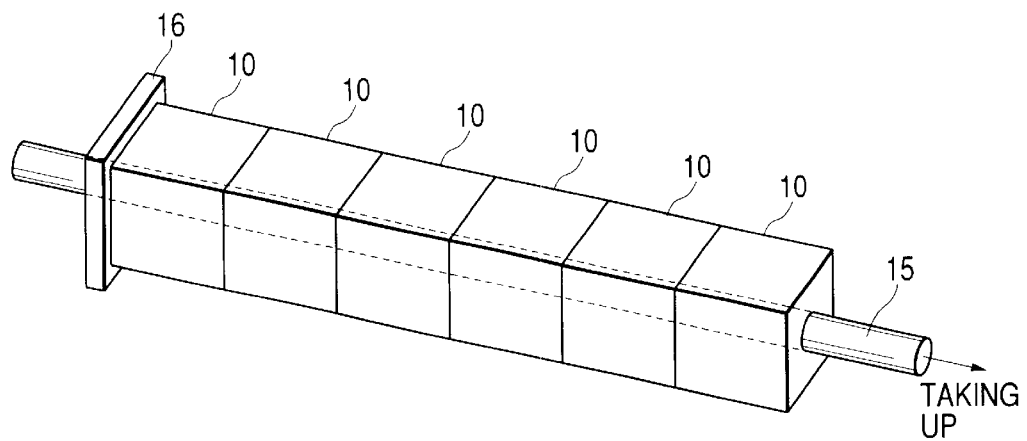
FIG. 11 is a perspective view of aligned semiconductor chips, a wire, and an engagement plate.

With reference to FIG. 11, after the alignment, an end of the group of the aligned semiconductor chips 10 is brought into contact with an engagement plate 16 fixed to the wire 15. Then, the wire 15 is taken up so that the aligned-semiconductor-chip group is moved together with the wire 15 while being in contact with the engagement plate 16. Accordingly, the aligned-semiconductor-chip group is conveyed to a desired place.

Thus, a plurality of semiconductor chips 10 are conveyed while the wire 15 (or the rod) extends through the holes 12 in the semiconductor chips 10 and the surfaces of the semiconductor chips 10 align. The conveyance of the semiconductor chips 10 is implemented by taking up the wire 15.

Figure 12:
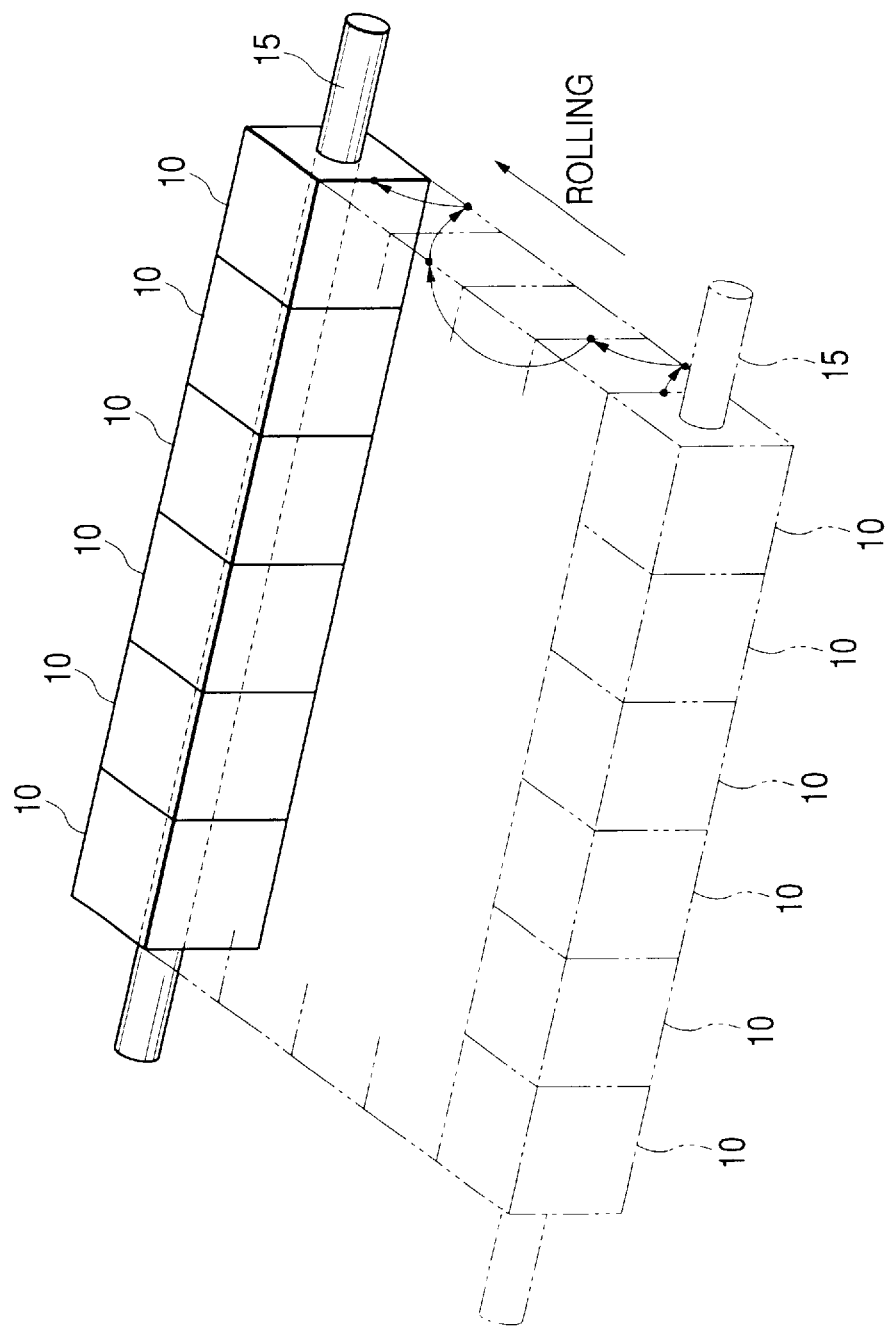
FIG. 12 is a perspective diagram of aligned semiconductor chips and a wire.

Semiconductor chips 10 may be conveyed as follows. With reference to FIG. 12, an aligned-semiconductor-chip group on a wire 15 is rolled to move in a direction perpendicular to the wire 15. Specifically, the aligned-semiconductor-chip group on the wire 15 is moved on a plane along a direction perpendicular to the wire 15 while being rotated about the wire 15.

Figure 13:
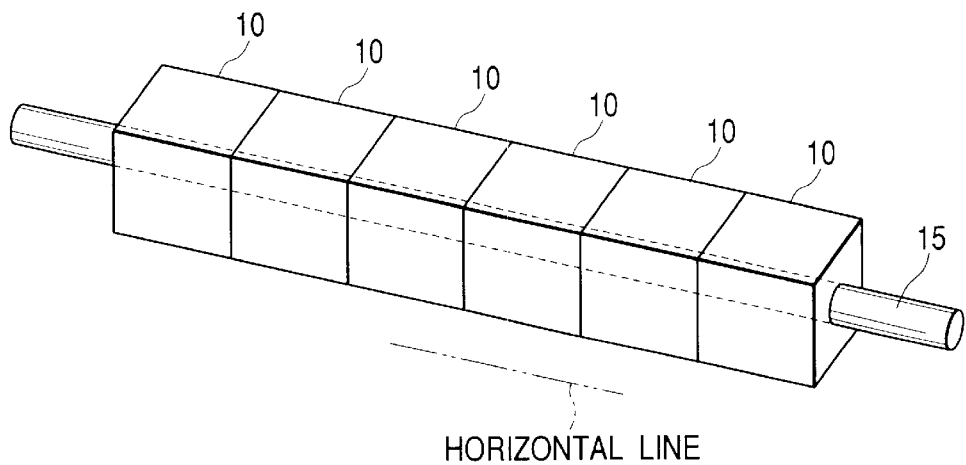
FIG. 13 is a perspective view of aligned semiconductor chips and a wire.
Figure 14:
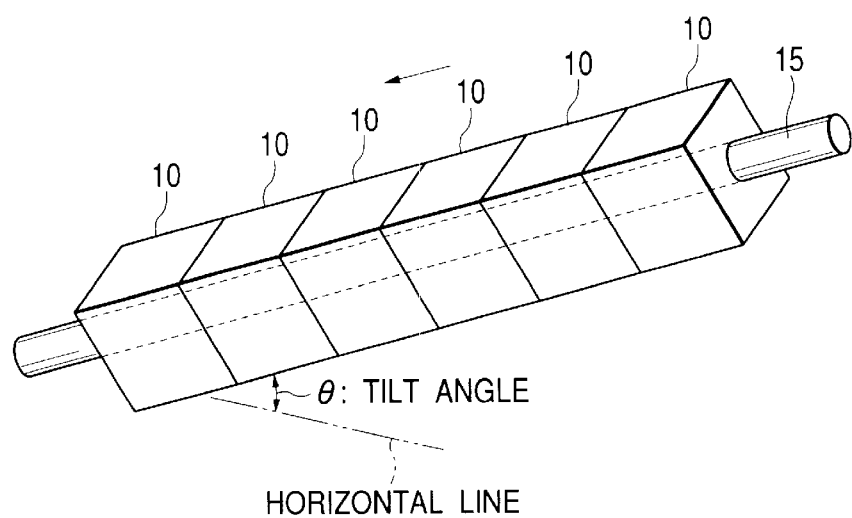
FIG. 14 is a perspective view of aligned semiconductor chips and a wire.

Semiconductor chips 10 may be conveyed as follows. With reference to FIG. 13, semiconductor chips 10 can slide on a wire 15. Thus, an aligned-semiconductor-chip group can slide on the wire 15. As shown in FIG. 14, the wire 15 and the semiconductor chips 10 are tilted so that the aligned-semiconductor-chip group spontaneously slides and moves along the wire 15.

Figure 15:
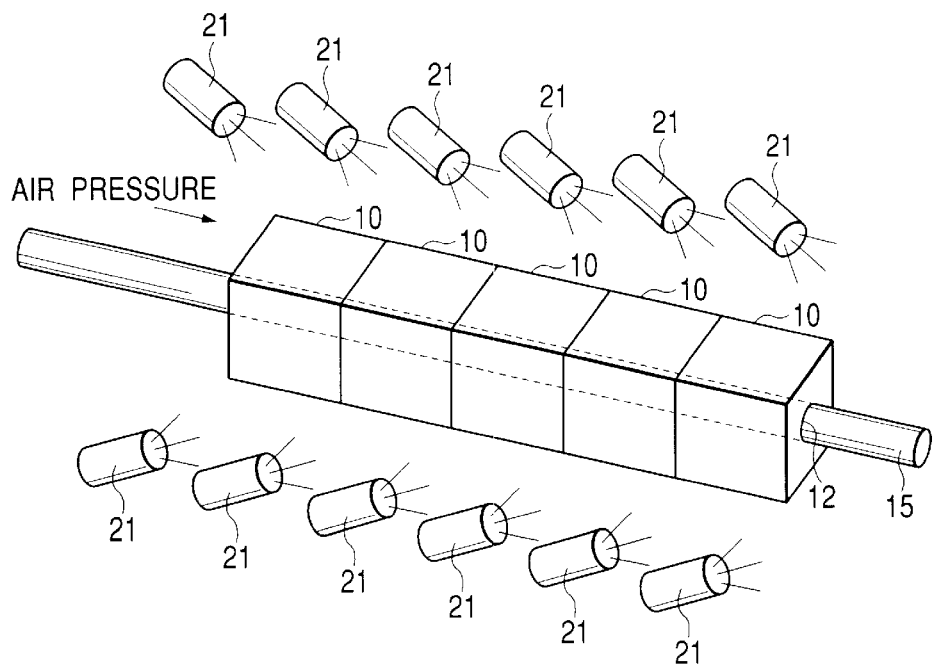
FIG. 15 is a perspective view of aligned semiconductor chips, a wire, and nozzles.

Semiconductor chips 10 may be conveyed as follows. With reference to FIG. 15, semiconductor chips 10 can slide on a wire 15. Thus, an aligned-semiconductor-chip group can slide on the wire 15. Flows of air discharged from nozzles 21 are applied to the aligned-semiconductor-chip group on the wire 15. The air flows force and move the aligned-semiconductor-chip group along the wire 15.

Semiconductor chips 10 can be conveyed in at least one of the methods in FIGS. 10–15 without being damaged. In more detail, semiconductor chips 10 can be stably conveyed while the surfaces thereof remain in alignment and the semiconductor chips 10 are neither scattered nor broken.

Semiconductor chips 10 are conveyed among processing places where semiconductor devices 11 are formed on the surfaces S1, S2, S3, and S4 of the semiconductor chips 10 by semiconductor device fabrication technologies including deposition, ion implantation, and diffusion. Since the surfaces S1, 52, S3, and S4 are flat, the formation of the semiconductor devices 11 is relatively easy.

Semiconductor devices 11 may be formed on the mirror finished surfaces of the semiconductor wafer 100 (see FIG. 3) which will form the two opposite surfaces S1 and S2 of each semiconductor chip 10. In this case, other semiconductor devices 11 may be formed on the mirror finished surfaces of a semiconductor rod (see FIGS. 4 and 5) which will form the two opposite surfaces S3 and S4 of each semiconductor chip 10.

The surfaces S1–S6 of each semiconductor chip 10 may be coated with protective films before the formation of a through hole 12 therein. Alternatively, the surfaces S1–S6 of each semiconductor chip 10 may be coated with protective films after the formation of a through hole 12 therein and before the conveyance thereof. The protective films include, for example, oxide films. The protective films prevent the semiconductor chip 10 from being contaminated by particles during the conveyance thereof.

The surfaces S1–S6 of each semiconductor chip 10 may be coated with sacrifice layers before the formation of a through hole 12 therein. Alternatively, the surfaces S1–S6 of each semiconductor chip 10 may be coated with sacrifice layers after the formation of a through hole 12 therein and before the conveyance thereof. The sacrifice layers include, for example, oxide layers. The sacrifice layers prevent the semiconductor chip 10 from being contaminated by particles during the conveyance thereof. After the conveyance of the semiconductor chip 10 is completed, the sacrifice layers are removed therefrom.

Semiconductor devices 11 can be formed on each semiconductor chip 10 at a relatively high density by conventional semiconductor-device fabrication technologies. The semiconductor chip 10 and the semiconductor devices 11 thereon compose a three-dimensional semiconductor unit 2 having a rectangular parallelepiped body. Three-dimensional semiconductor units 2 can be easily and accurately made. Three-dimensional semiconductor units 2 are assembled or combined into a stack (see FIG. 1) forming a semiconductor device arrangement having a relatively high semiconductor-device density.

The wire 15 or the rod used during the conveyance of semiconductor chips 10 can also be employed in the semiconductor device arrangement. For example, the wire 15 or the rod is made of electrically conductive material. At least a portion of the wire 15 or the rod is left as a rod-like electrode 3 which electrically connects three-dimensional semiconductor units 2 in a semiconductor device arrangement. Alternatively, the wire 15 or the rod may be made of insulating material. In this case, at least a portion of the wire 15 or the rod is left as a rod-like insulating member which mechanically connects and supports three-dimensional semiconductor units 2 in a semiconductor device arrangement.

Second Embodiment

A second embodiment of this invention is similar to the first embodiment thereof except for design changes indicated hereafter.

Figure 16:
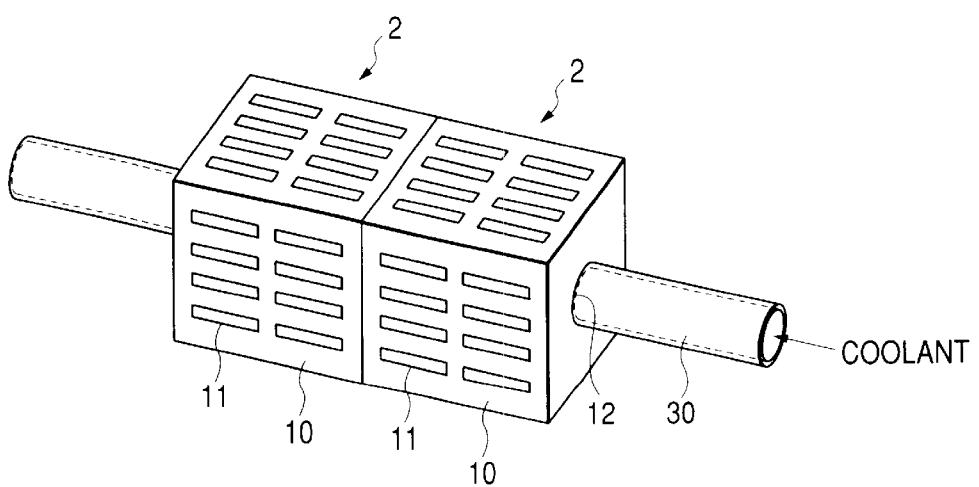
FIG. 16 is a perspective view of a semiconductor device arrangement according to a second embodiment of this invention.

FIG. 16 shows a semiconductor device arrangement according to the second embodiment of this invention. The arrangement of FIG. 16 includes a plurality of three-dimensional semiconductor units (three-dimensional semiconductor elements) 2 each having a through hole 12. A pipe 30 extends through the holes 12 in the three-dimensional semiconductor units 2. The pipe 30 may mechanically connect and support the three-dimensional semiconductor units 2. Furthermore, the pipe 30 may electrically connect the three-dimensional semiconductor units 2. Coolant flowing in the pipe 30 cools the semiconductor device arrangement.

Third Embodiment

A third embodiment of this invention is similar to the first embodiment thereof except for design changes indicated hereafter.

Figure 17:
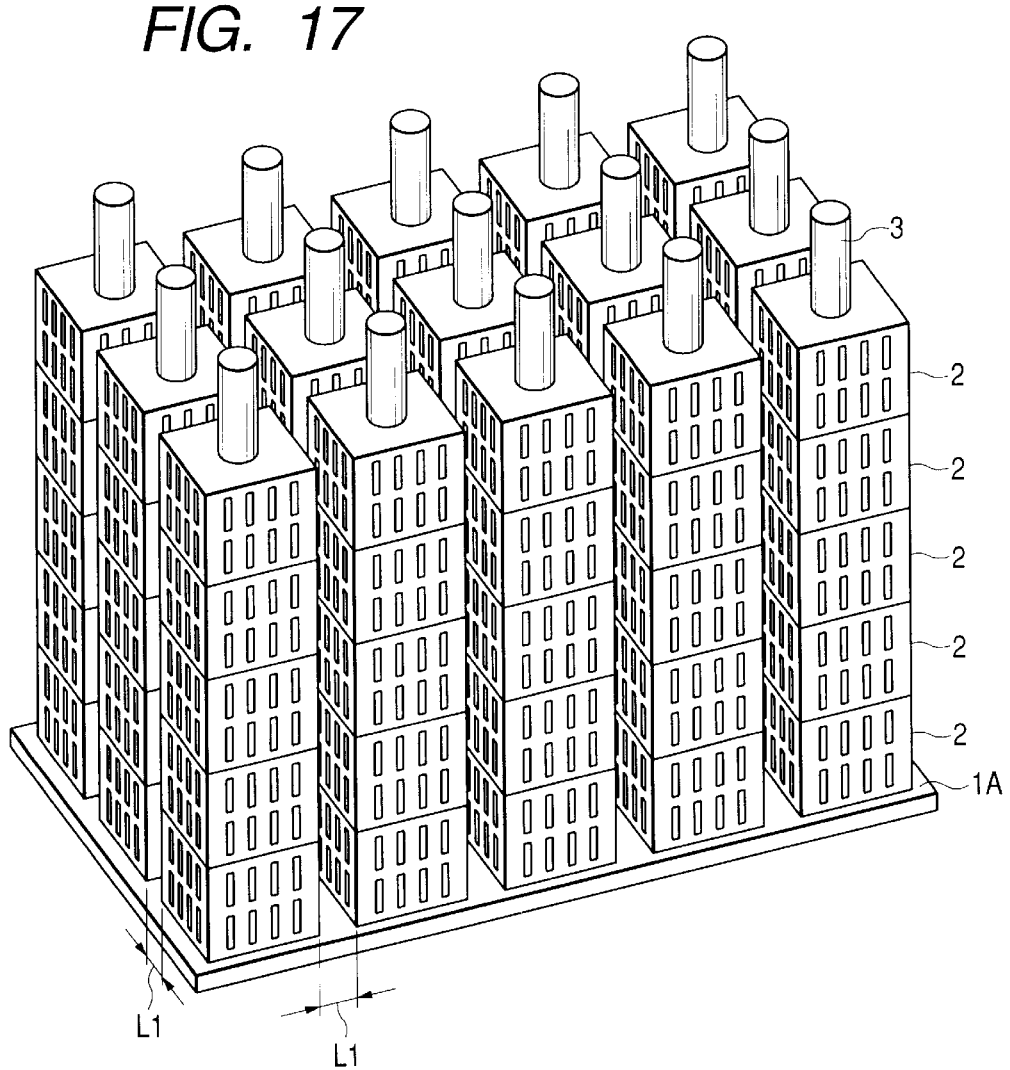
FIG. 17 is a perspective view of a semiconductor device arrangement according to a third embodiment of this invention.

FIG. 17 shows a semiconductor device arrangement according to the third embodiment of this invention. The arrangement of FIG. 17 includes a base plate 1A, and pillar-shaped stacks of three-dimensional semiconductor units (three-dimensional semiconductor elements) 2 placed on the base plate 1A. The pillar-shaped stacks of the three-dimensional semiconductor units 2 are spaced at equal prescribed intervals L1. The spaces among the pillar-shaped stacks provide good heat radiation and cooling performances. Thus, the pillar-shaped stacks of the three-dimensional semiconductor units 2 are in the configuration of a radiating fin producing good heat radiation and cooling performances.

Fourth Embodiment

A fourth embodiment of this invention is similar to the first embodiment thereof except for design changes indicated hereafter.

Figure 18:
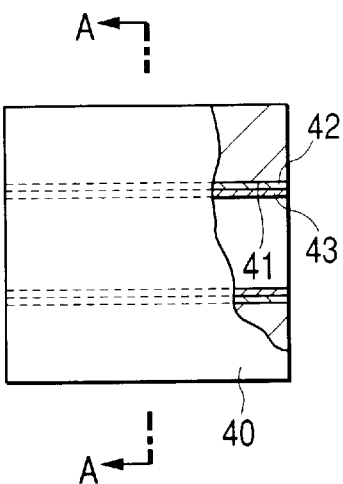
FIG. 18 is a side view, partially in section, of a semiconductor chip in a fourth embodiment of this invention.
Figure 19:
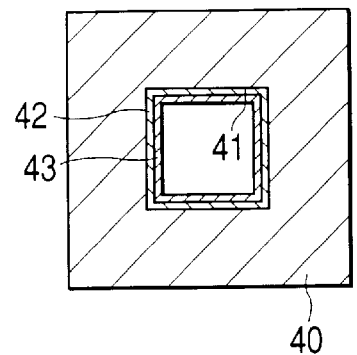
FIG. 19 is a sectional view of the semiconductor chip as taken along the line A—A in FIG. 18.

According to the fourth embodiment of this invention, as shown in FIGS. 18 and 19, a semiconductor chip 40 having a rectangular parallelepiped body is prepared. The semiconductor chip 40 corresponds to the semiconductor chip 10 in FIG. 2. The semiconductor chip 40 uses a single crystal of silicon. The semiconductor chip 40 is formed with a through hole 41 of a quadrilateral cross-section, a rectangular cross-section, or a square cross-section. The whole of the inner surfaces of the semiconductor-chip walls which define the through hole 41 are coated with a silicon dioxide film 42. The silicon dioxide film 42 will form an etching mask. A layer 43 of resist is superposed on the whole surface of the silicon dioxide film 42.

Figure 20:
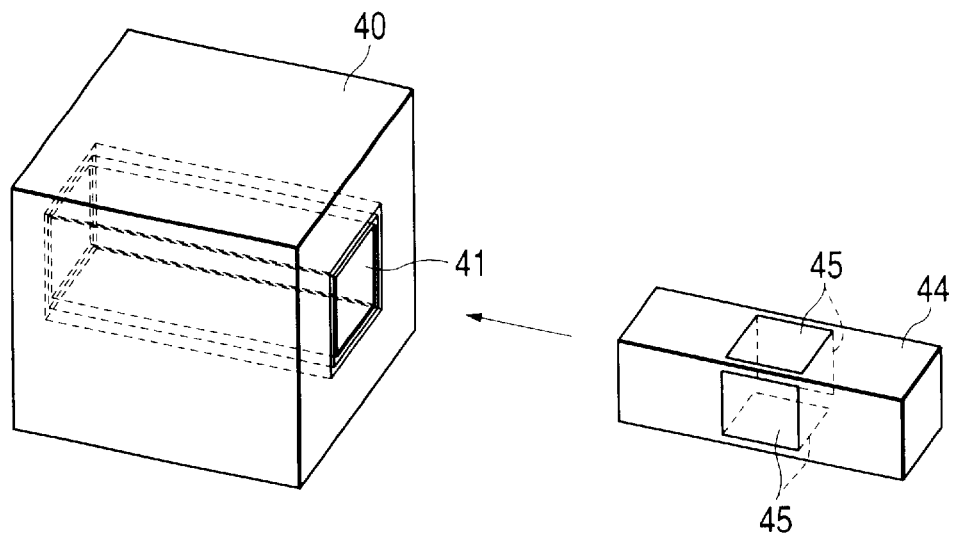
FIG. 20 is a perspective view of a semiconductor chip and an optical-fiber member.
Figure 21:
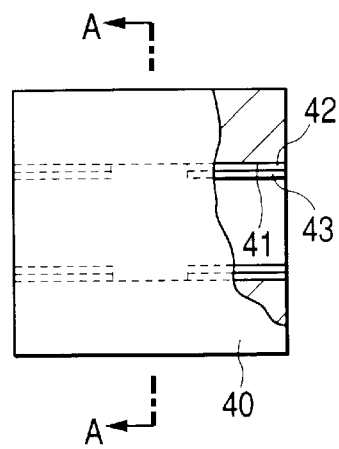
FIG. 21 is a side view, partially in section, of a semiconductor chip.
Figure 22:
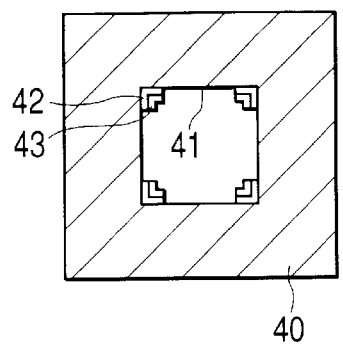
FIG. 22 is a sectional view of the semiconductor chip as taken along the line A—A in FIG. 21.

As shown in FIG. 20, an optical-fiber member 44 is inserted into the through hole 41 in the semiconductor chip 40 which is defined by the resist layer 43. The optical-fiber member 44 has the shape of a rectangular column or a square column. The optical-fiber member 44 has four side surfaces formed with windows 45 respectively. Light is propagated in the optical-fiber member 44 before existing therefrom via the windows 45 and meeting the resist layer 43. Thus, the resist layer 43 is exposed to light via the windows 45. Then, the optical-fiber member 44 is removed from the through hole 41, and the resist layer 43 is developed to have openings which correspond to the windows 45. Subsequently, the silicon dioxide film 42 is subjected to patterning or etching while the resist layer 43 is used as a mask. Consequently, the resist layer 43 and the silicon dioxide film 42 are shaped to have openings as shown in FIGS. 21 and 22.

Figure 23:
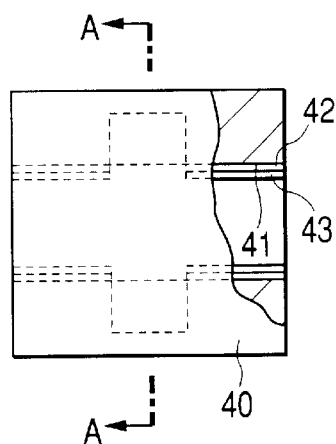
FIG. 23 is a side view, partially in section, of a semiconductor chip.
Figure 24:
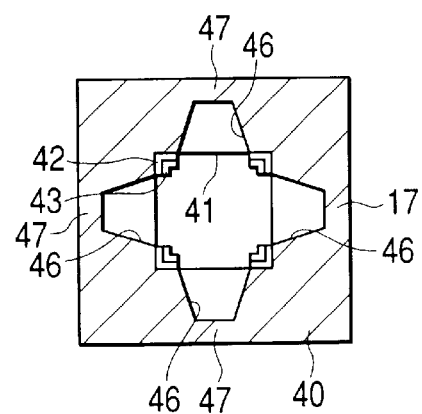
FIG. 24 is a sectional view of the semiconductor chip as taken along the line A—A in FIG. 23.

Thereafter, the single-silicon-crystal body of the semiconductor chip 40 is etched from the through hole 41 for a prescribed time while the resist layer 43 and the silicon dioxide film 42 are used as a mask. Consequently, as shown in FIGS. 23 and 24, the inner surfaces of the walls of the semiconductor chip 40 are formed with recesses 46 which align with the openings in the resist layer 43 and the silicon dioxide film 42.

In this way, the areas of the inner wall surfaces of the semiconductor chip 40 which extend at the openings in the resist layer 43 and the silicon dioxide film 42 are etched by a prescribed degree to have the recesses 46. The walls of the semiconductor chip 40 at the bottoms of the recesses 46 form thin-wall portions, that is, diaphragms 47.

Figure 25:
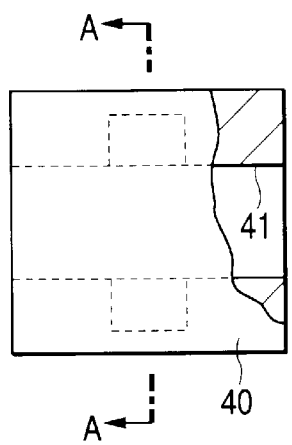
FIG. 25 is a side view, partially in section, of a semiconductor chip.
Figure 26:
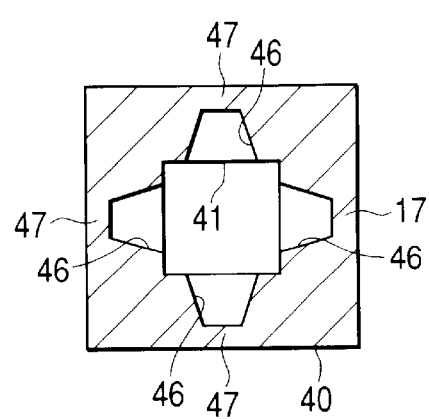
FIG. 26 is a sectional view of the semiconductor chip as taken along the line A—A in FIG. 25.

Thereafter, as shown in FIGS. 25 and 26, the resist layer 43 and the silicon dioxide film 42 are removed from the semiconductor chip 40.

As understood from the above description, the inner wall surfaces of the semiconductor chip 40 are subjected to photolithography and etching from the through hole 41. Thus, different surface portions of the semiconductor chip 40 which constitutes a three-dimensional semiconductor unit are formed with the diaphragms (the thin-wall portions) 47. Accordingly, the semiconductor chip 40 has the thin-wall portions 47.

The thin-wall portions 47 can be used in forming semiconductor devices. Specifically, one semiconductor chip 40 can be formed with a semiconductor sensor and a sensor signal processing circuit. Thus, it is possible to provide a highly functional semiconductor unit. The semiconductor sensor is designed to detect temperature, fluid flow rate, or pressure.

In more detail, a portion of a three-dimensional semiconductor unit can be used to form a semiconductor sensor for detecting temperature, fluid flow rate, or pressure while the surface of another portion of the three-dimensional semiconductor unit can be formed with a sensor signal processing circuit. Such a three-dimensional semiconductor unit can implement both sensing and control (signal processing). Thus, it is possible to provide a highly functional semiconductor unit.

Fifth Embodiment

A fifth embodiment of this invention is similar to the first embodiment thereof except for design changes indicated hereafter.

Figure 27:
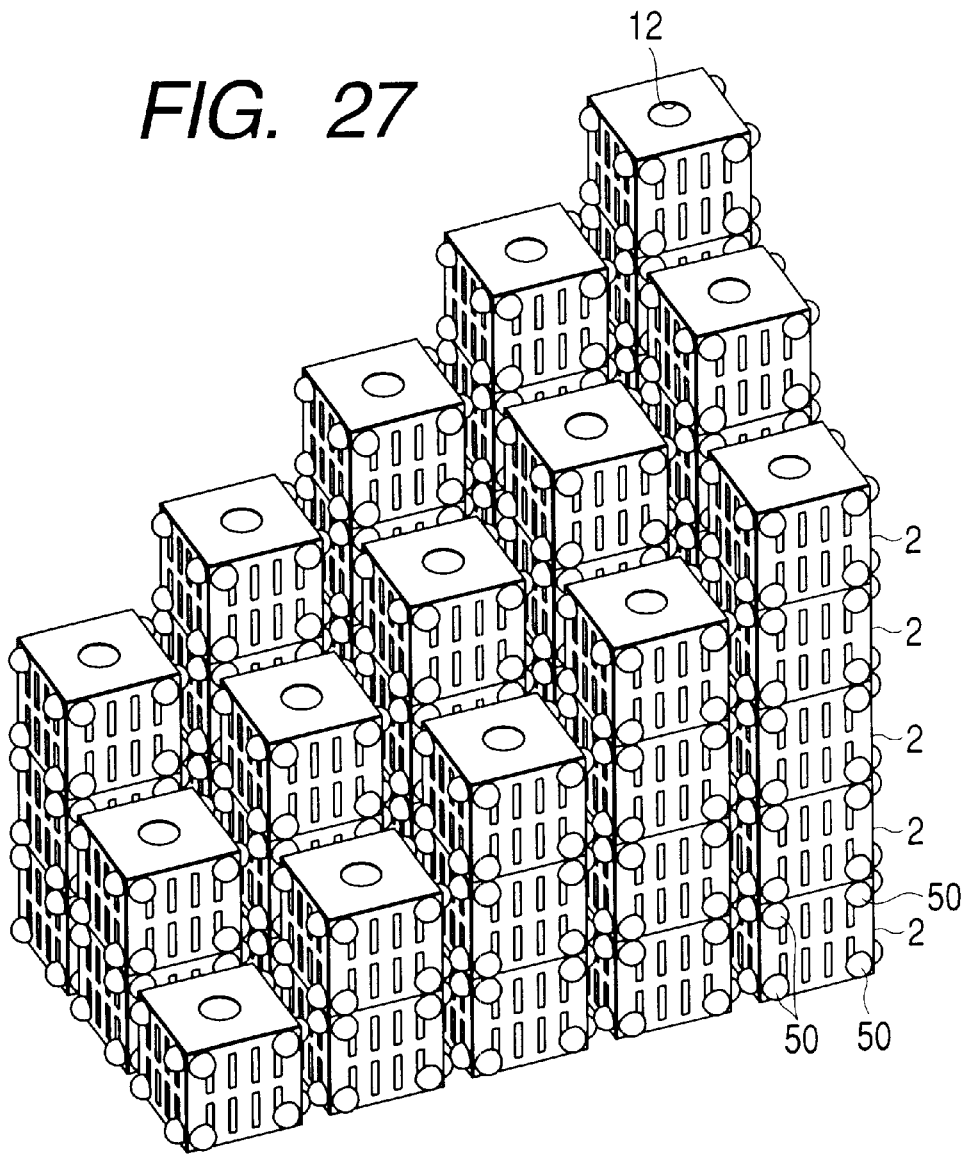
FIG. 27 is a perspective view of a semiconductor device arrangement according to a fifth embodiment of this invention.

FIG. 27 shows a semiconductor device arrangement according to the fifth embodiment of this invention. The arrangement of FIG. 27 includes three-dimensional semiconductor units (three-dimensional semiconductor elements) 2. The rod-like electrode 3 (see FIG. 1) is omitted from the arrangement of FIG. 27.

In the arrangement of FIG. 27, surfaces of the three-dimensional semiconductor units 2 are formed with bumps (projection electrodes) 50. The three-dimensional semiconductor units 2 are electrically and mechanically connected to each other by the bumps 50. Specifically, bumps 50 are formed on at least one surface of each of the three-dimensional semiconductor units 2. Bumps 50 on a first three-dimensional semiconductor unit 2 and bumps 50 on a second three-dimensional semiconductor unit 2 are directly bonded together so that the two three-dimensional semiconductor units 2 are mechanically connected and supported and are electrically connected. Accordingly, the three-dimensional semiconductor units 2 can be arranged into a laminate having any one of various shapes. Thus, it is possible to provide an arrangement of three-dimensional semiconductor units 2 which can fit in a space having any one of various shapes.

A predetermined number of three-dimensional semiconductor units 2 are arranged along at least one of a vertical direction, a horizontal direction, and a height direction while surfaces thereof are in contact with or opposed to each other. The predetermined number can be changed arbitrarily. As a result, it is possible to provide a semiconductor device arrangement having an arbitrary three-dimensional shape.

The through holes 12 in the three-dimensional semiconductor units 2 are used for the conveyance thereof.

Sixth Embodiment

A sixth embodiment of this invention is similar to the first embodiment thereof except for design changes indicated hereafter.

Figure 28:
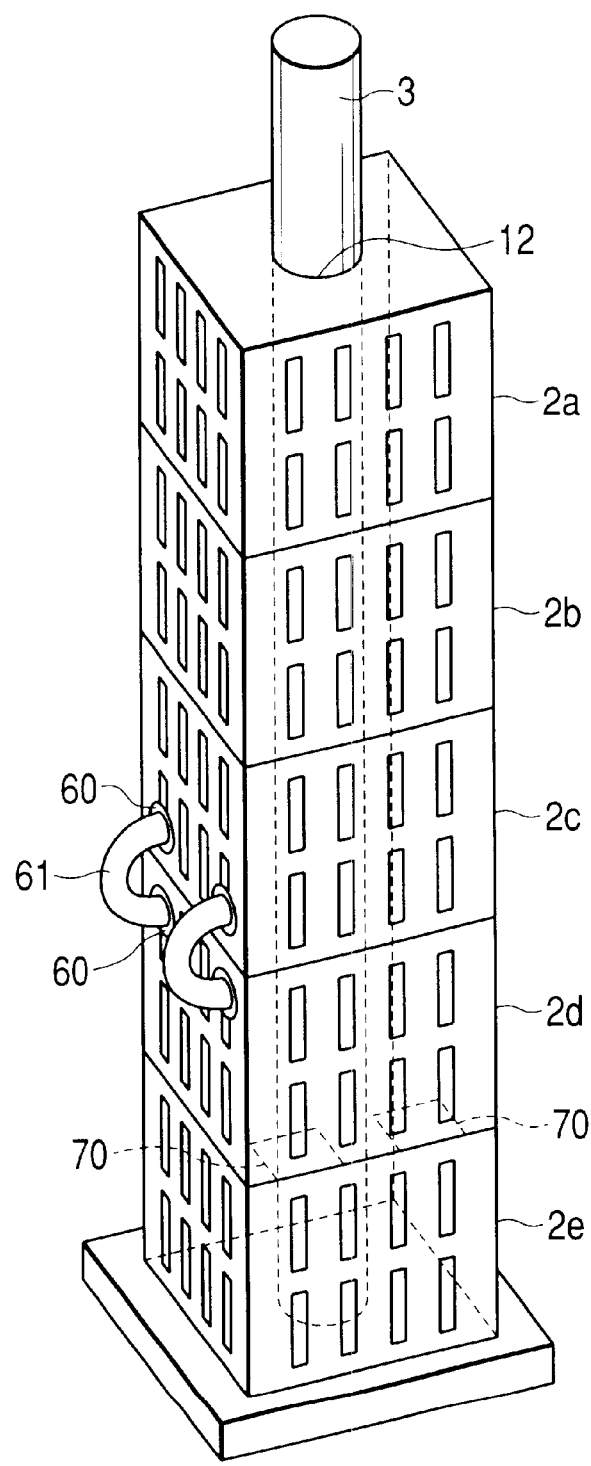
FIG. 28 is a perspective view of a semiconductor device arrangement according to a sixth embodiment of this invention.

FIG. 28 shows a semiconductor device arrangement according to the sixth embodiment of this invention. The arrangement of FIG. 28 includes three-dimensional semiconductor units (three-dimensional semiconductor elements) designed as power devices 2a, 2b, and 2c, a logic device 2d, and a memory device 2e respectively. The power devices 2a, 2b, and 2c, the logic device 2d, and the memory device 2e are arranged in that order to compose a pillar-shaped stack. Electrical connections among the power devices 2a, 2b, and 2c, the logic device 2d, and the memory device 2e are of three types (i), (ii), and (iii) as follows.

(i) A rod-like electrode 3 which extends in through holes 12 of the power devices 2a, 2b, and 2c forms a current flow path among the power devices 2a, 2b, and 2c.

(ii) Flat electrodes 70 are formed on an upper surface of the memory device 2e. Flat electrodes 70 are formed on a lower upper surface of the logic device 2d. The flat electrodes 70 on the memory device 2e and the flat electrodes 70 on the logic device 2d are in direct contact, thereby providing electrical connection between the memory device 2e and the logic device 2d.

(iii) Pads (bonding pads) 60 are formed on a side surface of the power device 2c. Pads (bonding pads) 60 are formed on a side surface of the logic device 2d. The pads 60 on the power device 2c and the pads 60 on the logic device 2d are connected by wires 61 so that the power device 2c and the logic device 2d are electrically connected. Thus, the electrical connection between the power device 2c and the logic device 2d is based on wire bonding.

As previously mentioned, flat electrodes 70 or pads 60 are formed on at least one surface of each of the three-dimensional semiconductor units 2c, 2d, and 2e. The flat electrodes 70 on the three-dimensional semiconductor unit 2e and the flat electrodes 70 on the three-dimensional semiconductor unit 2d are in direct contact. The pads 60 on the three-dimensional semiconductor unit 2c and the pads 60 on the three-dimensional semiconductor unit 2d are connected by the wires 61. Thereby, the three-dimensional semiconductor units 2c, 2d, and 2e are electrically connected.

Seventh Embodiment

A seventh embodiment of this invention is similar to the third embodiment thereof except for design changes indicated hereafter.

Figure 29:
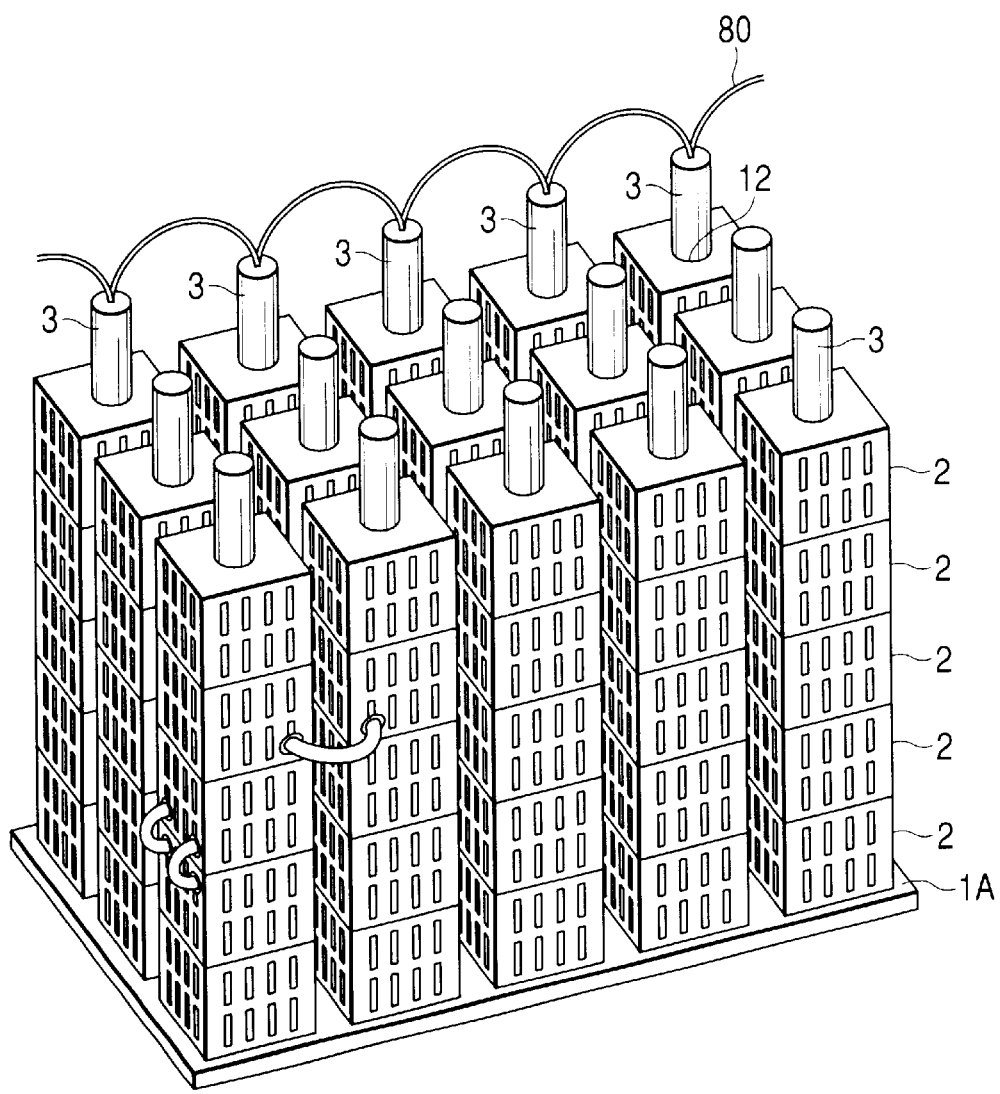
FIG. 29 is a perspective view of a semiconductor device arrangement according to a seventh embodiment of this invention.

FIG. 29 shows a semiconductor device arrangement according to the seventh embodiment of this invention. The arrangement of FIG. 29 includes rod-like electrodes 3 extend into respective pillar-shaped stacks of three-dimensional semiconductor units (three-dimensional semiconductor elements) 2. Through holes 12 in the three-dimensional semiconductor units 2 accommodate the rod-like electrodes 3.

As shown in FIG. 29, upper ends of the rod-like electrodes 3 project from the pillar-shaped stacks of the three-dimensional semiconductor units 2. The upper ends of the rod-like electrodes 3 are electrically connected by wires 80. Thus, the electrical connections among the rod-like electrodes 3 are based on wire bonding.

It should be noted that the rod-like electrodes 3 may be replaced by wire-like electrodes.

Eighth Embodiment

An eighth embodiment of this invention is similar to the sixth embodiment thereof except for design changes indicated hereafter.

Figure 30:
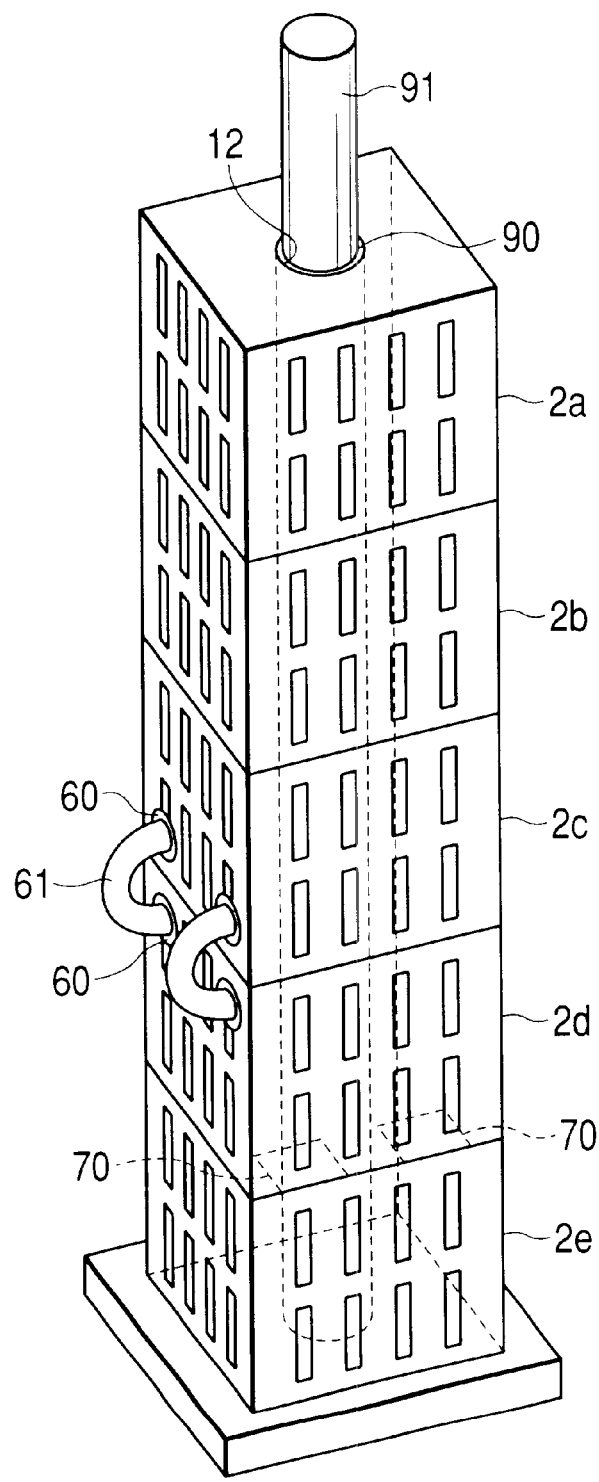
FIG. 30 is a perspective view of a semiconductor device arrangement according to an eighth embodiment of this invention.

FIG. 30 shows a semiconductor device arrangement according to the eighth embodiment of this invention. The arrangement of FIG. 30 includes a metal film (an electrically-conductive thin film) 90 formed on the inner surfaces of the three-dimensional semiconductor units 2a–2e which define the through holes 12. The formation of the metal film 90 is implemented by sputtering. The three-dimensional semiconductor units 2a–2e are electrically connected by the metal film 90.

An insulating rod 91 is inserted into the through holes 12 of the three-dimensional semiconductor units 2a–2e. The insulating rod 91 provides a sufficient mechanical strength of the semiconductor device arrangement. The insulating rod 91 may be replaced by an electrically conductive rod (an electrode).

Ninth Embodiment

A ninth embodiment of this invention is similar to one of the first, second, third, fifth, sixth, seventh, and eighth embodiments thereof except for design changes indicated hereafter.

According to the ninth embodiment of this invention, only one among the six surfaces S1–S6 of a semiconductor chip 10 is formed with semiconductor devices 11.

Tenth Embodiment

A tenth embodiment of this invention is similar to one of the first, second, third, fifth, sixth, seventh, and eighth embodiments thereof except for design changes indicated hereafter.

According to the tenth embodiment of this invention, only two among the six surfaces S1–S6 of a semiconductor chip 10 are formed with semiconductor devices 11.

Eleventh Embodiment

An eleventh embodiment of this invention is similar to one of the first, second, third, fifth, sixth, seventh, and eighth embodiments thereof except for design changes indicated hereafter.

According to the eleventh embodiment of this invention, only three among the six surfaces S1–S6 of a semiconductior chip 10 are formed with semiconductor devices 11.

Twelfth Embodiment

A twelfth embodiment of this invention is similar to one of the first, second, third, fifth, sixth, seventh, and eighth embodiments thereof except for design changes indicated hereafter.

According to the twelfth embodiment of this invention, only five among the six surfaces S1–S6 of a semiconductor chip 10 are formed with semiconductor devices 11.

Thirteenth Embodiment

A thirteenth embodiment of this invention is similar to one of the first, second, third, fifth, sixth, seventh, and eighth embodiments thereof except for design changes indicated hereafter.

According to the thirteenth embodiment of this invention, all the six surfaces S1–S6 of a semiconductor chip 10 are formed with semiconductor devices 11.

Fourteenth Embodiment

Figure 31:
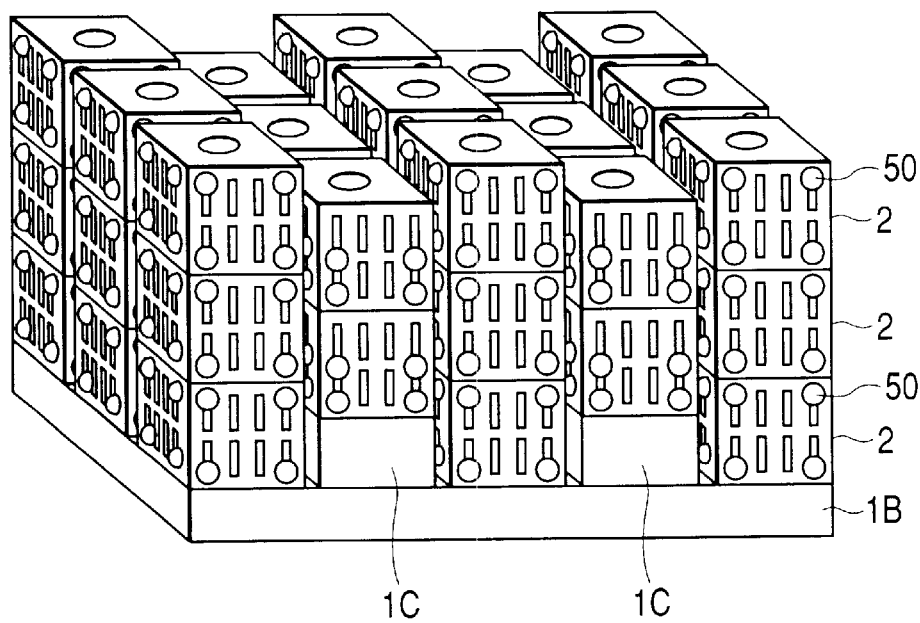
FIG. 31 is a perspective view of a semiconductor device arrangement according to a fourteenth embodiment of this invention.
Figure 32:
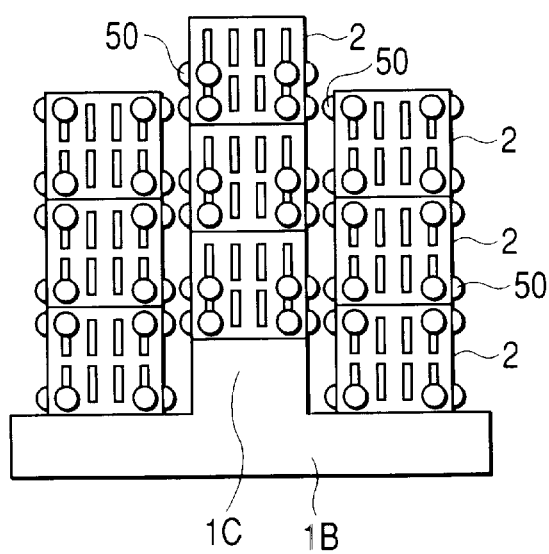
FIG. 32 is a front view of a portion of the semiconductor device arrangement in FIG. 31.

FIGS. 31 and 32 show a semiconductor device arrangement according to a fourteenth embodiment of this invention. The arrangement of FIGS. 31 and 32 is similar to that of FIG. 27 except for design changes indicated hereafter.

The arrangement of FIGS. 31 and 32 includes a base plate 1B, and pillar-shaped stacks of three-dimensional semiconductor units (three-dimensional semiconductor elements) 2 placed on the base plate 1B. The upper surface of the base plate 1B has projections 1C horizontally spaced from each other. First alternate ones of the pillar-shaped stacks are placed on the projections 1C while second alternate ones of the pillar-shaped stacks are placed on regions of the base plate 1B between the projections 1C. Accordingly, three-dimensional semiconductor units 2 in a pillar-shaped stack are offset or different in height position from those in a next pillar-shaped stack.

Bumps 50 are formed on side surfaces of each of the three-dimensional semiconductor units 2. Bumps 50 on one side surface of each three-dimensional semiconductor unit 2 in a first pillar-shaped stack are directly bonded to bumps 50 on side surfaces of two three-dimensional semiconductor units 2 in a second pillar-shaped stack next to the first pillar-shaped stack. Similarly, bumps 50 on one side surface of each three-dimensional semiconductor unit 2 in the second pillar-shaped stack are directly bonded to bumps 50 on side surfaces of two three-dimensional semiconductor units 2 in the first pillar-shaped stack. Therefore, three-dimensional semiconductor units 2 in two neighboring pillar-shaped stacks are mutually supported in vertical directions.

What is claimed is:

1. A semiconductor device arrangement comprising:
    a plurality of three-dimensional semiconductor units (2), wherein each of the three-dimensional semiconductor units (2) includes a semiconductor chip (10) in a shape of a rectangular parallelepiped having six surfaces (S1–S6), and semiconductor devices (11) formed on at least one among the six surfaces (S1–S6); and
    means (3, 50, 60, 61, 70, 90, 91) for mechanically connecting and supporting the three-dimensional semiconductor units (2), and electrically connecting the three-dimensional semiconductor units (2).

2. A semiconductor device arrangement as recited in claim 1, wherein the semiconductor chips (10) in the three-dimensional semiconductor units (2) have through holes (12) respectively, and the means comprises one of a wire and a rod (3) inserted into the through holes to mechanically connect and support the three-dimensional semiconductor units (2).

3. A semiconductor device arrangement as recited in claim 1, wherein the semiconductor chips (10) in the three dimensional semiconductor units (2) have through holes (12) respectively, and the means comprises one of a wire electrode and a rod electrode (3) inserted into the through holes to electrically connect the three-dimensional semiconductor units (2).

4. A semiconductor device arrangement as recited in claim 1, wherein the semiconductor chips (10) in the three-dimensional semiconductor units (2) have through holes (12) respectively, and the means comprises electrically conductive films (90) formed on inner surfaces of the semiconductor chips (10) which define the through holes (12) to electrically connect the three-dimensional semiconductor units (2).

5. A semiconductor device arrangement as recited in claim 1, wherein at least one of the three-dimensional semiconductor units (2) has at least one flat surface formed with an electrode (50, 60, 70).

6. A semiconductor device arrangement as recited in claim 5, wherein the electrode comprises a flat electrode (70).

7. A semiconductor device arrangement as recited in claim 6, wherein the means comprises a flat electrode (70) on first one of the three-dimensional semiconductor units (2) and a flat electrode (70) on second one of the three-dimensional semiconductor units (2) which are in direct contact to electrically connect the first one and the second one of the three-dimensional semiconductor units (2).

8. A semiconductor device arrangement as recited in claim 5, wherein the electrode comprises a bump (50).

9. A semiconductor device arrangement as recited in claim 8, wherein the means comprises a bump (50) on first one of the three-dimensional semiconductor units (2) and a bump (50) on second one of the three-dimensional semiconductor units (2) which are directly bonded together to mechanically connect and support, and electrically connect the first one and the second one of the three-dimensional semiconductor units (2).

10. A semiconductor device arrangement as recited in claim 5, wherein the electrode comprises a bonding pad (60).

11. A semiconductor device arrangement as recited in claim 10, wherein the means comprises a bonding pad (60) on first one of the three-dimensional semiconductor units (2) and a bonding pad (60) on second one of the three-dimensional semiconductor units (2) which are connected by a wire (61) to electrically connect the first one and the second one of the three-dimensional semiconductor units (2).

12. A semiconductor device arrangement as recited in claim 2, wherein the semiconductor devices (11) are formed on two sets of opposite surfaces (S1–S4) among the six surfaces (S1–S6), and the through hole (12) is open at the two remaining opposite surfaces (S5, S6) among the six surfaces (S1–S6).

13. A semiconductor device arrangement as recited in claim 1, wherein the semiconductor chips (10) in the three-dimensional semiconductor units (2) have through holes (12) respectively, and further comprising a pipe (30) inserted into the through holes (12) for conducting coolant.

14. A semiconductor device arrangement as recited in claim 1, wherein the semiconductor devices (11) comprise thin-wall portions (47) of the semiconductor chips (10).

15. A semiconductor device arrangement as recited in claim 1, wherein the three-dimensional semiconductor units (2) are in a pillar-shaped stack.

16. A semiconductor device arrangement as recited in claim 1, wherein the semiconductor devices (11) comprise films formed on flat surfaces of the semiconductor chips (10).

17. A semiconductor device arrangement as recited in claim 2, wherein each of the through holes (12) has a circular cross-section.

18. A semiconductor device arrangement as recited in claim 2, wherein each of the through holes (12) has an angular cross-section.

19. A semiconductor device arrangement as recited in claim 1, wherein the three-dimensional semiconductor units (2) are in pillar-shaped stacks spaced at prescribed distances (L1).

20. A semiconductor device arrangement as recited in claim 1, wherein a predetermined number of the three-dimensional semiconductor units (2) are arranged in at least one among a vertical direction, a horizontal direction, and a height direction while surfaces of the three-dimensional semiconductor units (2) are in contact or opposed to each other.

21. A semiconductor device arrangement as recited in claim 1, wherein the semiconductor chips (10) include silicon as semiconductor material.

22. A semiconductor device arrangement as recited in claim 1, wherein the three-dimensional semiconductor units (2) have bumps (50) and are in pillar-shaped stacks including first and second pillar-shaped stacks neighboring each other, wherein three-dimensional semiconductor units (2) in the first pillar-shaped stack are offset in height position from three-dimensional semiconductor units (2) in the second pillar-shaped stack, and wherein bumps of a three-dimensional semiconductor unit (2) in the first pillar-shaped stack are bonded to bumps (50) of two three-dimensional semiconductor units (2) in the second pillar-shaped stack.

* * * * *